United States Patent
Sun et al.

(10) Patent No.: US 10,216,332 B2
(45) Date of Patent: Feb. 26, 2019

(54) COLOR FILTER SUBSTRATE AND IN-CELL TOUCH DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Le Sun, Beijing (CN); Yezhou Fang, Beijing (CN); Zhengwen Pan, Beijing (CN); Wei Zhang, Beijing (CN); Kunpeng Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 50 days.

(21) Appl. No.: 15/504,144

(22) PCT Filed: Jul. 15, 2016

(86) PCT No.: PCT/CN2016/090113
§ 371 (c)(1),
(2) Date: Feb. 15, 2017

(87) PCT Pub. No.: WO2017/117966
PCT Pub. Date: Jul. 13, 2017

(65) Prior Publication Data
US 2018/0107337 A1    Apr. 19, 2018

(30) Foreign Application Priority Data

Jan. 4, 2016   (CN) .......................... 2016 1 0004884

(51) Int. Cl.
*G06F 3/045* (2006.01)
*G06F 3/041* (2006.01)
(Continued)

(52) U.S. Cl.
CPC ............. *G06F 3/0418* (2013.01); *G02B 1/16* (2015.01); *G02F 1/13338* (2013.01);
(Continued)

(58) Field of Classification Search
CPC ...... G06F 3/0418; G06F 3/044; G06F 3/0412; G06F 2203/04107; G02B 1/16;
(Continued)

(56) References Cited

U.S. PATENT DOCUMENTS 6,879,353 B2   4/2005  Moon et al.
9,018,716 B1   4/2015  Chou et al.
(Continued)

FOREIGN PATENT DOCUMENTS

CN    101819348 A    9/2010
CN    104090677 A    10/2014
(Continued)

OTHER PUBLICATIONS

International Search Report and Written Opinion dated Sep. 26, 2016; PCT/CN2016090113.
(Continued)

*Primary Examiner* — Adam R. Giesy
(74) *Attorney, Agent, or Firm* — Ladas & Parry LLP; Loren K. Thompson (57) ABSTRACT

A color filter substrate and an in-cell touch display device are disclosed. The color filter substrate including a display region and a non-display region surrounding the display region, wherein the color filter substrate further includes a conductive antistatic layer, and the antistatic layer is only disposed in the non-display region. The in-cell touch display
(Continued)

device can eliminate static electricity under the premise of having no influence on touch function, and the in-cell touch display device is provided with an enhanced anti-electrostatic capability.

20 Claims, 6 Drawing Sheets

(51) Int. Cl.
*G02B 1/16* (2015.01)
*G02F 1/1333* (2006.01)
*G02F 1/1335* (2006.01)
*G06F 3/044* (2006.01)
*G02F 1/1345* (2006.01)
*H05K 1/02* (2006.01)

(52) U.S. Cl.
CPC .. *G02F 1/133512* (2013.01); *G02F 1/133514* (2013.01); *G06F 3/044* (2013.01); *G06F 3/0412* (2013.01); *G02F 1/13452* (2013.01); *G02F 2001/133388* (2013.01); *G02F 2202/22* (2013.01); *G06F 2203/04107* (2013.01); *H05K 1/0259* (2013.01); *H05K 2201/10128* (2013.01)

(58) Field of Classification Search
CPC .......... G02F 1/13338; G02F 1/133512; G02F 1/133514; G02F 1/13452; G02F 2202/22
See application file for complete search history.

(56) References Cited

U.S. PATENT DOCUMENTS

| | | | |
|---|---|---|---|
| 2009/0310052 A1 | 12/2009 | Huang et al. | |
| 2015/0103260 A1* | 4/2015 | Ho | G06F 3/044 349/12 |
| 2016/0161813 A1* | 6/2016 | Lee | G02F 1/133308 349/12 |
| 2016/0246417 A1 | 8/2016 | Liu et al. | |

FOREIGN PATENT DOCUMENTS

| | | |
|---|---|---|
| CN | 104808835 A | 7/2015 |
| CN | 105022520 A | 11/2015 |
| CN | 105044976 A | 11/2015 |
| CN | 105068306 A | 11/2015 |
| CN | 204790246 U | 11/2015 |
| CN | 105138188 A | 12/2015 |
| CN | 105425458 A | 3/2016 |

OTHER PUBLICATIONS

First Chinese Office Action dated Jul. 28, 2016; Appln. No. 201610004884.7.
Second Chinese Office Action dated Dec. 29, 2016; Appln. No. 201610004884.7.
Chinese Search Report dated May 13, 2016; Appln. 201610004884.7.

* cited by examiner

COLOR FILTER SUBSTRATE AND IN-CELL TOUCH DISPLAY DEVICE

TECHNICAL FIELD

Embodiments of the present disclosure relate to a color filter substrate and an in-cell touch display device.

BACKGROUND

A liquid crystal display (LCD) includes an array substrate and a color substrate that are cell-assembled together, and a liquid crystals between the array substrate and the color substrate. In the production and use of the liquid crystal display, the color filter substrate is prone to generate static electricity. Electro-static field will be generated when the electro-static is accumulated to a certain extent. The electro-static field will interfere with the arrangement of liquid crystal molecules, resulting in abnormal display, or even breakdown of a circuit board of the array substrate, causing damage to the display device, so it is important to eliminate static electricity on the LCD.

Generally, the static electricity is conducted out to achieve an effect of eliminating the static electricity by disposing a plate-shaped transparent conductive antistatic layer between a base substrate of the color substrate and a polarizer, and the antistatic layer is connected with a ground terminal of the array substrate by coating a conductive silver adhesive.

SUMMARY

Embodiments of the present invention provides a color filter substrate and an in-cell touch display device, and the in-cell touch display device can eliminate static electricity under the premise of having no influence on touch function, and the in-cell touch display device is provided with an enhanced anti-electrostatic capability.

In one aspect, embodiments of the present invention provide a color filter substrate comprising a display region and a non-display region surrounding the display region, wherein the color filter substrate further comprises a conductive antistatic layer, and the antistatic layer is only disposed in the non-display region.

For example, the color filter substrate further comprises a base substrate and a black matrix located on the base substrate, the black matrix and the antistatic layer are located on a same side of the base substrate.

For example, the antistatic layer is located on the black matrix and in contact with the black matrix.

For example, the color filter substrate further comprises a planarization layer, and an alignment film and a conductive member which are located on the planarization layer, the planarization layer covers the base substrate with the antistatic layer formed thereon, and the color filter layer further comprises a via hole, the via hole passes through the planarization layer and the alignment film, and the conductive member is connected with the antistatic layer through the via hole.

For example, the color filter substrate further comprises a conductive member, and the conductive member is connected with the antistatic layer through a via hole.

For example, the color filter substrate further comprises an alignment film located on the black matrix, and the antistatic layer is in contact with the alignment film and located on the alignment film.

For example, the antistatic layer is annular and surrounds a whole circumference of the display region.

For example, a material of the antistatic layer is metal or metal oxide.

In another aspect, embodiments of the present invention provide an in-cell touch display device comprising an array substrate, and the in-cell touch display device further comprises any one of the above-mentioned color filter substrates.

For example, the antistatic layer of the color filter substrate is electrically connected with a first ground terminal of the array substrate.

For example, the in-cell touch display device further comprises a second ground terminal and a driving circuit module, wherein the second ground terminal is disposed on a position of the array substrate where is opposite to the color filter substrate, and the driving circuit module is disposed on a side of the array substrate where is not opposite to the color filter substrate, the first ground terminal is integrated in the driving circuit module, and the first ground terminal is electrically connected with the second ground terminal.

For example, the color substrate comprises a base substrate, and a black matrix, an antistatic layer, a planarization layer, and an alignment film which are disposed on a side of the base substrate of the color substrate close to the array substrate in sequence, the color substrate further comprises a via hole, the via hole passes through the passivation layer and the alignment layer to expose the antistatic layer, and the color substrate further comprises a conductive member, and an end of the conductive member is connected with the antistatic layer via the via hole, and the other end of the conductive member is connected with the second ground terminal.

For example, the color substrate comprises a base substrate, and a black matrix, an alignment film and an antistatic layer which are disposed on a side of the base substrate of the color substrate close to the array substrate in sequence, and the antistatic layer is connected with the second ground terminal.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the present invention and thus are not limitative of the present invention.

REFERENCE NUMERALS

1—color substrate; 100—display region; 200—non-display region; 201—sealant region; 202—isolation region; 10—base of color substrate; 11—antistatic layer; 12—black matrix; 13—color filter layer; 14—planarization layer; 15—alignment film; 16—via hole; 17—conductive member; 18—protection layer; 2—array substrate; 20—first ground terminal; 21—driving circuit module; 22—second ground terminal; 23—edge portion; 3—liquid crystal; 4—polarizer; 121—non-display-region black matrix; 122—display-region black matrix; 5—touch layer; 51—touch unit; 501—insulation layer or planarization layer.

DETAILED DESCRIPTION

In order to make objects, technical details and advantages of the embodiments of the present invention apparent, the technical solutions of the embodiments will be described in a clearly and fully understandable way in connection with the drawings related to the embodiments of the present invention. Apparently, the described embodiments are just a part but not all of the embodiments of the present invention. Based on the described embodiments herein, those skilled in the art can obtain other embodiment(s), without any inventive work, which should be within the scope of the present invention.

In the description of embodiments of the present invention, it is to be understood that orientations or position relationships indicated by the terms "on," "under," and the like are based on orientations or position relationships illustrated in the figures, only for convenience in describing of the present invention and simplifying of the description, rather than to indicate or imply that the device or element must have a particular orientation, be constructed and operated in a particular orientation, and therefore should not be construed as a limit of the present invention.

With continuously development of in-cell touch technique, it is difficult to prevent static electricity by disposing an antistatic layer in some in-cell touch display devices. Taking a full in-cell touch display device as an example, the full in-cell touch display device can be based on a self-capacitance principle, a single-layer touch-trace design is adopted, touch units are embedded into liquid crystal pixels, and touch display can be realized with aid of a capacitor formed between a finger and a touch unit. If an antistatic layer is provided between a base substrate of a color filter substrate of a touch display device and a polarizer, while the finger is touching the touch display device, the antistatic layer will affect the capacitance between the finger and the touch unit, thereby reduce the touch effect. Therefore, it becomes an important research topic to eliminate static electricity of a touch display device under the premise of without affecting touch function.

First Embodiment

Figure 1:
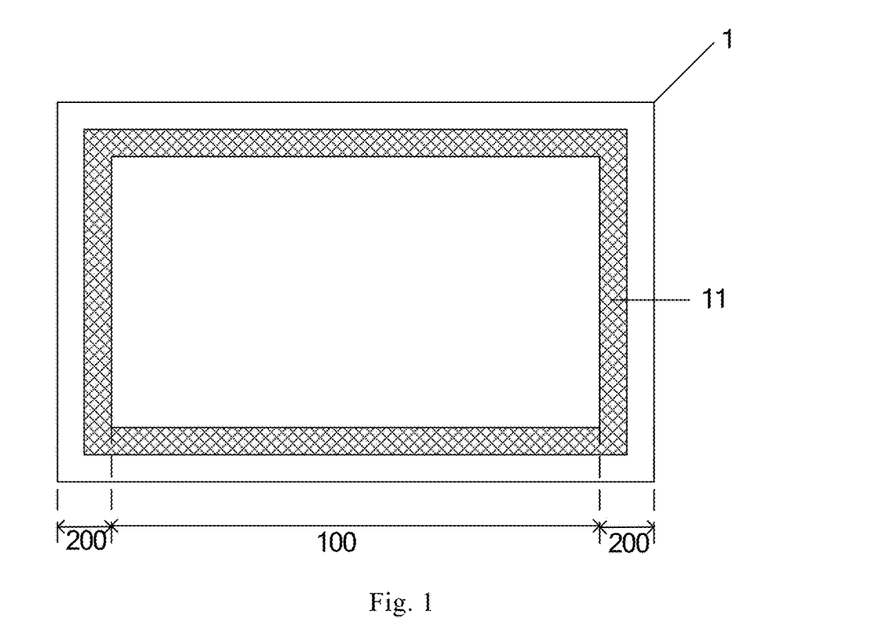
FIG. 1 is a first structural schematic view of a color substrate provided by an embodiment of the present invention.

As illustrated in FIG. 1, the embodiment provides a color filter substrate including a display region 100 and a non-display region 200 surrounding the display region 100. The color filter substrate further includes a conductive antistatic layer 11, and the antistatic layer 11 is only disposed in the non-display region 200.

It is to be noted that, the above-mentioned color filter substrate can be cell-assembled with an array substrate by a sealant to form a display device. The display region is a region configured to realize display of a color substrate to display a picture for a viewer, a region other than the display region is a non-display region.

In the above-mentioned color substrate, the antistatic layer can cover all of the non-display region, of course, can also cover a portion of the non-display region, limitations are not imposed thereto. For example, the antistatic layer is annular and surrounds a whole periphery (circumstance) of the display region, and in this way, static electricity accumulated on the color substrate can be conducted out to a large extent. The embodiments and drawings are illustrated by taking the antistatic layer being annular and surrounding the whole periphery of the display region as an example. Moreover, a material, thickness, or shape and the like of the antistatic layer are not limited in embodiments of the present invention, as long as the static electricity can be conducted out. As illustrated in FIG. 1, the antistatic layer 11 is not disposed in the display region 100.

For example, the above-mentioned color substrate can further include a base substrate, and a black matrix and a color filter layer which are located on the base substrate. Further, if the above-mentioned color substrate is applied to an in-cell touch display device, the color substrate can further include a touch layer, if the above-mentioned color substrate is applied to a liquid crystal display device, the color substrate can further include a planarization layer and an alignment film and the like, detail descriptions will be omitted here.

The embodiment provides a color filter substrate including a display region and a non-display region surrounding the display region. The color filter substrate further includes a conductive antistatic layer, and the antistatic layer is only disposed in the non-display region. If the color substrate is applied to an ill-cell touch display device, because the antistatic layer is only disposed in the non-display region, while a finger of a user is touching the touch display device, a capacitor between the finger and the touch unit cannot be affected by the antistatic layer, and the static electricity can be simultaneously conducted out. Therefore, the in-cell touch display device including the color filter substrate can eliminate static electricity without affecting touch function, and has strong antistatic capability.

Figure 2:
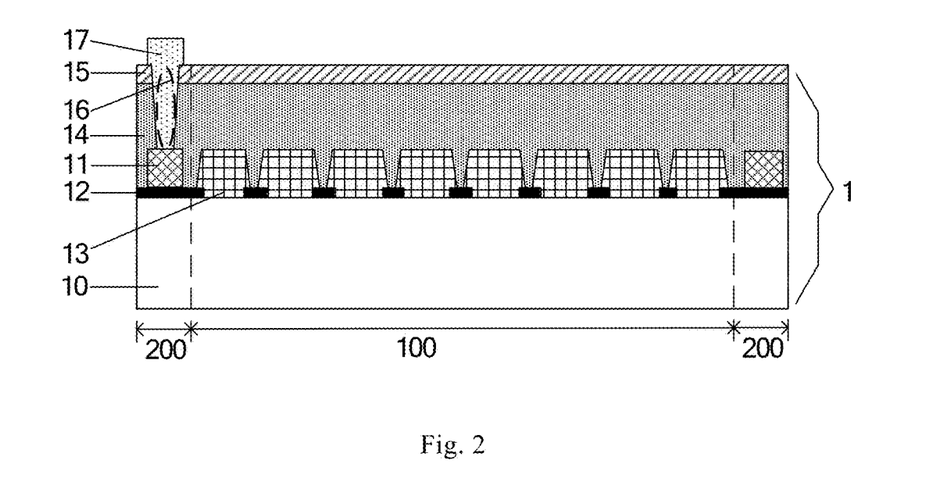
FIG. 2 is a second structural schematic view of a color substrate provided by an embodiment of the present invention.
Figure 3A:
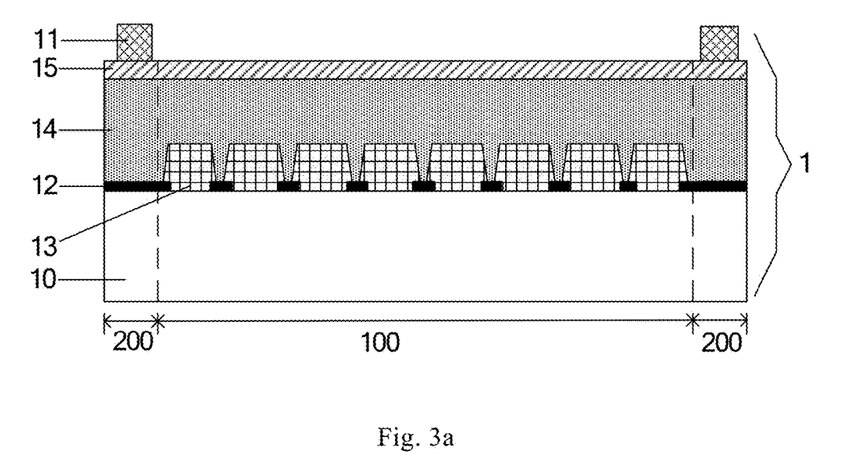
FIG. 3a is a third structural schematic view of a color substrate provided by an embodiment of the present invention.
Figure 3B:
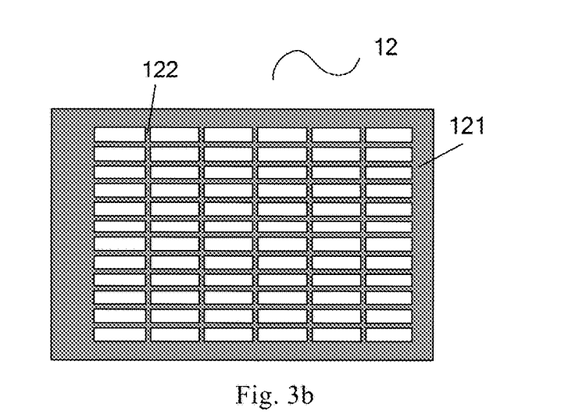
FIG. 3b is a schematic view of a pattern of a black matrix.

Referring to FIG. 2 and FIG. 3a, to prevent light leakage, the above-mentioned color substrate 1 further includes a base substrate 10 and a black matrix 12 located on the base substrate 10. Usually, as illustrated in FIG. 3b, the black matrix 12 is disposed in both the display region and the non-display region, the black matrix 12 has a mesh distribution in the display region, and a continuous distribution in the non-display region (that is, covering the entire non-display region), which correspond to a non-display-region black matrix 121 and a display-region black matrix 122. For example, the non-display-region black matrix 121 and the display-region black matrix 122 can be integrally formed, connected with each other. It is to be further noted that, referring to FIG. 2 and FIG. 3a, the black matrix 12 and the antistatic layer 11 can be on a same side of the base substrate 10; of course, the black matrix and the antistatic layer can be on different sides of the base substrate (not illustrated in the figure), limitations are not imposed thereto. If the black matrix and the antistatic layer are on different sides of the base substrate, there is a need to provide an additional layer as an antistatic layer, and without doubt, a thickness of the color substrate can be increased, and a thickness of a display device can be increased accordingly. If the black matrix and the antistatic layer are disposed on a same side of the base substrate, the antistatic layer can be disposed in the same layer with other layers (for example, color filter layer 13 as illustrated in FIG. 2, etc.), and disposition of a separate layer can be avoided, and a thickness of the color substrate cannot be increased. The embodiments and drawings are illustrated by taking the black matrix and the antistatic layer being disposed on the same side of the base substrate as an example.

For example, as illustrated in FIG. 2, the antistatic layer 11 is located on the black matrix 12 and in contact with the black matrix 12. Usually, the black matrix is uncharged itself. However, in the normal operation of a LCD, the black matrix will induce charge, and have a certain voltage, to maintain a balance of the electric field inside a cell. At the same time, in the production and subsequent transport of a LCD, the color filter substrate will inevitably accumulate static electricity, and the static electricity makes distribution of inductive potential on the black matrix imbalance, which will affect rotation of liquid crystal molecules, and finally affect display effect of the LCD. Usually voltage of the black matrix can be measured to determine the status of electrostatic accumulation of a color filter substrate. Therefore, static electricity accumulated on the black matrix can be eliminated. The antistatic layer being in contact with the black matrix can conduct out the static electricity accumulated on the black matrix, which will be benefit to eliminate the static electricity accumulated on the color filter substrate.

Referring to FIG. 2, to realize color display, the color filter substrate 1 further includes a color filter layer 13 located on the black matrix 12, and the color filter layer 13 is only disposed in the display region. It should be noted that the color filter layer 13 and the antistatic layer 11 can be provided in the same layer, so that the thickness of the color filter substrate is not increased. Referring to FIG. 2, the so-called disposed in the same layer means that different regions of a film layer on the black matrix 12 can be patterned by a patterning process to form the color filter layer 13 and the antistatic layer 11 located in the same layer.

For further example, in order to facilitate the connection of the antistatic layer with a ground terminal of an array substrate to conduct out the static electricity, as illustrated in FIG. 2, the color filter substrate 1 further includes a planarization layer 14, an alignment film 15 and a conductive member 17 which are disposed on the planarization layer 14. The planarization layer 14 covers the base substrate 10 with the antistatic layer 11 provided thereon. The color substrate further includes a via hole 16, the via hole 16 passes through the planarization layer 14 and the alignment film 15, and the conductive member 17 is connected with the antistatic layer 11 via the via hole 16. It should be noted that, the planarization layer is generally disposed on entire base substrate with a plane surface to facilitate the disposition of the alignment film in subsequent process. In the embodiment of the present invention, the amount of via holes is not limited. In order to simplify the production process, it is sufficient to provide one via hole. The embodiment of the present invention and the drawings are described by taking a color filter substrate including one via hole as an example. It is to be further noted that the material and shape of the conductive member are not limited thereto. For example, referring to FIG. 2, the via hole 16 can be filled by a portion of the conductive member 17, the shape of which is determined by the shape of the via hole 16; the other portion of the conductive member 17 with a cylindrical, ladder, or rectangular shape etc. extends out of the via hole 16. The embodiments of the present invention and the drawings are described by taking that the portion of the conductive member extending out of the via hole is cylinder as an example.

For example, referring to FIG. 3a, the color filter substrate 1 further includes an alignment film 14 disposed on the black matrix 12, and the antistatic layer 11 is in contact with the alignment film 14 and is located on the alignment film 14. With the structure in which the antistatic layer is disposed on the alignment film, the antistatic layer can be directly connected with the ground terminal of the array substrate after the color filter substrate and the array substrate are cell-assembled.

With respect to the structure illustrated in FIG. 2, in the structure illustrated in FIG. 3a, via hole manufacturing process can be omitted, and no need to provide a conductive member to connect the antistatic layer and the ground terminal of the array substrate. That is, one patterning process can be omitted with respect to the structure of FIG. 2, the manufacturing process is simple. However, the antistatic layer in the structure of FIG. 2 is disposed closely on and in contact with the black matrix after the color filter substrate and the array substrate are cell-assembled, the antistatic layer is located farther from metal lines (e.g., gate lines, data lines, etc.) of the array substrate, with respect to the structure of FIG. 3a, the structure in FIG. 2 can reduce the effect of the antistatic layer on the metal lines of the array substrate to a certain extent. Both structures have their own pros and cons, the specific choice can be based on the actual application.

Figure 4:
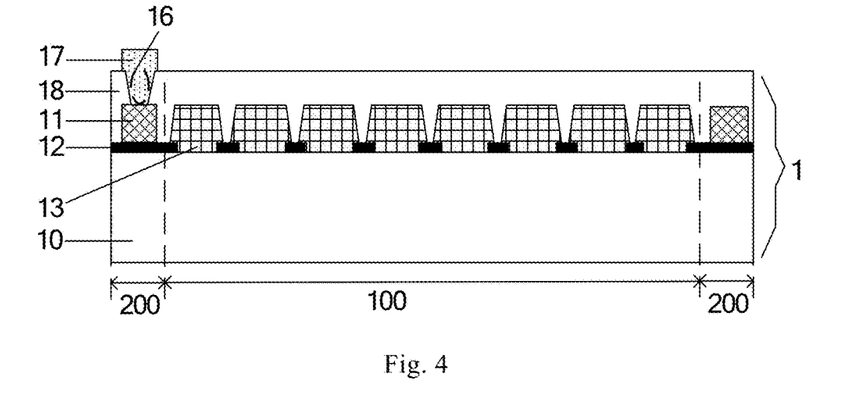
FIG. 4 is a fourth structural schematic view of a color substrate provided by an embodiment of the present invention.
Figure 5:
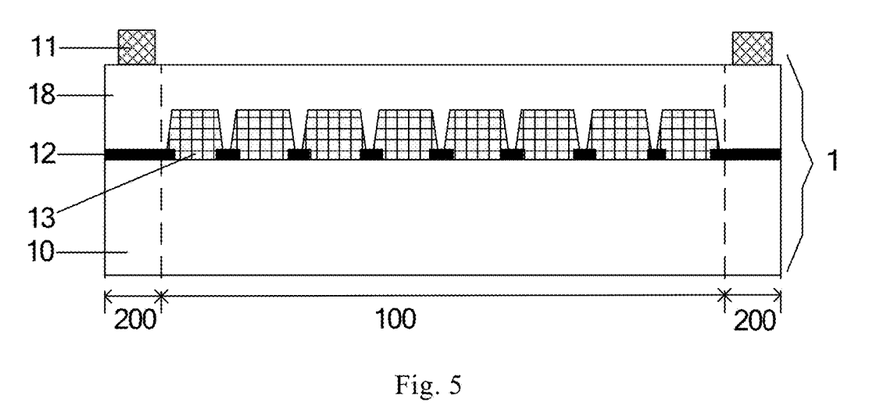
FIG. 5 is a fifth structural schematic view of a color substrate provided by an embodiment of the present invention.

It is to be noted that, the structure of the above-mentioned color filter substrate is not limited to that illustrated in FIG. 2 and FIG. 3. When a color filter substrate is applied to a different type of liquid crystal display device, the structure thereof is changed accordingly. In general, a liquid crystal display device includes an array substrate and a color filter substrate that are cell-assembled together, and liquid crystals located between the array substrate and the color filter substrate. For example, liquid crystals include types such as nematic phase, smectic phase, cholesteric phase, and blue phase and so on. Compared with other types of liquid crystals, the blue phase liquid crystal does not require an initial alignment. Therefore, it is not necessary to provide an alignment film when the color filter substrate is applied to a blue phase liquid crystal display device. However, the application of the blue phase liquid crystal display devices is relatively less used due to the limitation of transparency and driving voltage. Referring to FIG. 4, the color filter substrate can further include a protection layer 18 and a conductive member 17 located on the protection layer 18. The protection layer 18 covers a base substrate 10 with an antistatic layer 11 provided thereon. The color filter substrate further includes a via hole 16, the via hole 16 passes through the protection layer 18, and the conductive member 17 is connected with the antistatic layer 11 via the via-hole 16. Of course, referring to FIG. 5, the color filter substrate can further include a protection layer 18 disposed on the black matrix 12, and the antistatic layer 11 is in contact with the protection layer 18 and disposed on the protection layer 18.

Figure 6A:
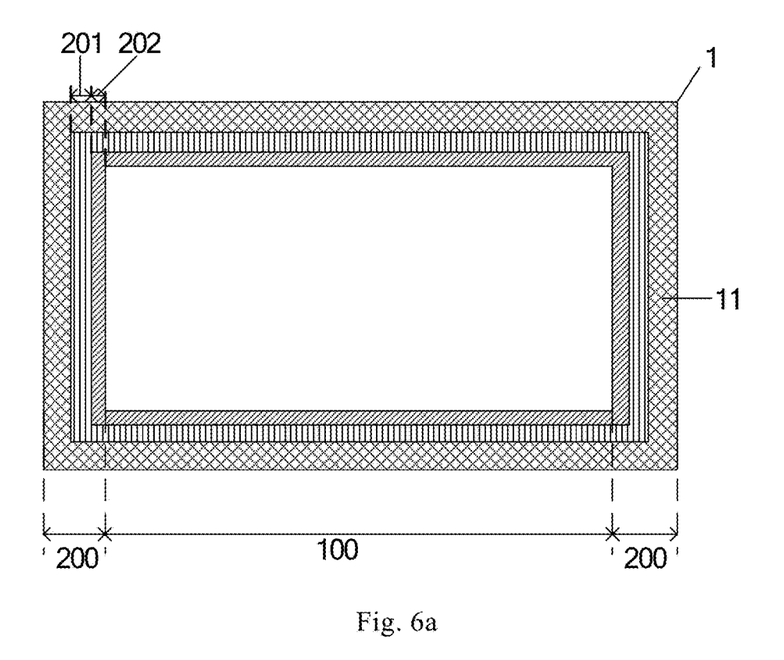
FIG. 6a is a sixth structural schematic view of a color array substrate provided by an embodiment of the present invention.

For example, the antistatic layer is annular and surrounds a whole circumference (periphery) of the display region, thus static electricity can be conducted out to a maximize extent, and antistatic capability can be enhanced. It is to be noted that, the above-mentioned color substrate can be cell-assembled with an array substrate to form a display device, as illustrated in FIG. 6a, the non-display region 200 of the color filter substrate can further include a sealant region 201 for disposing a sealant and an isolation region 202, the isolation region 202 is a region between the sealant region 201 and the display region 100. The isolation region 202 can isolate the sealant region 201 and the display region 100 to avoid affecting display effect which is caused by a portion of the sealant entered to the display region because of process error. The one-circle antistatic layer can be located in the isolation region or in the non-display region 200 other than the sealant region 201 illustrated in FIG. 6a, limitations are not imposed thereto, and the latter may be selected so that the effect on the liquid crystal can be avoided. Furthermore, the display region is generally rectangular, and therefore the annular shape can be a rectangular ring as illustrated in FIG. 6a, and can be a circular ring or the like, and the former may be selected for ease of manufacture.

Figure 6B:
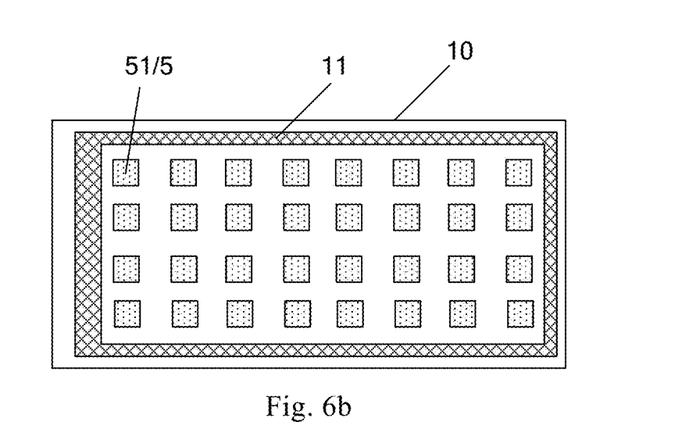
FIG. 6b is a top schematic view of a touch layer and an antistatic layer of a color substrate provided by an embodiment of the present invention.

As illustrated in FIG. 6b, in one example, a self-capacitance touch layer is used as an example. A touch layer 5 and an antistatic layer 11 are disposed on the base substrate 10. The touch layer 5 includes a plurality of touch units 51 arranged in arrays, and a pattern of the touch layer 5 and a pattern of the antistatic layer 11 do not overlap (coincide) in a direction perpendicular to the base substrate 10. That is, an orthographic projection of the pattern of the touch layer 5 on the base substrate 10 does not overlap an orthographic projection of the antistatic layer 11 on the base substrate 10. Therefore, the influence of the antistatic layer 11 on touch can be avoided, and the antistatic layer does not affect the capacitance between the finger and the touch unit, and at the same time the static electricity can be conducted out. It should be noted that the present example is described by taking a self-capacitance touch layer as an example. The present embodiments are not limited to self-capacitance structure, but can also be a mutual capacitance structure.

Figure 6C:
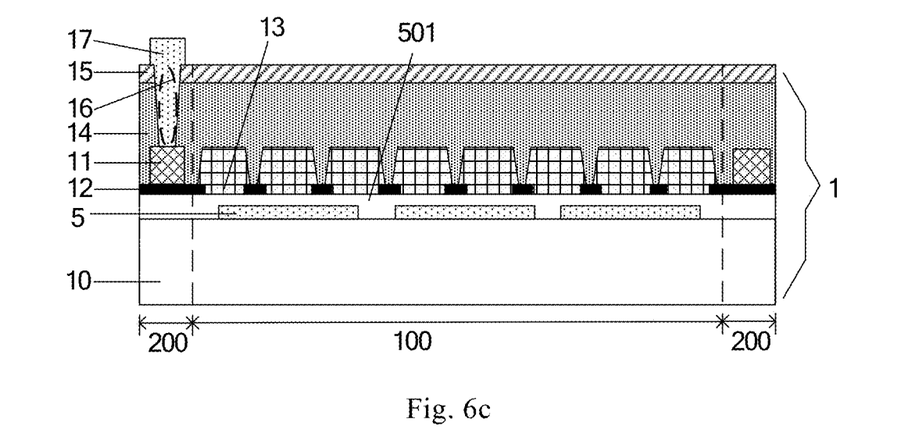
FIG. 6c is a seventh structural schematic view of a color substrate provided by an embodiment of the present invention.

As illustrated in FIG. 6c, the touch layer 5 is disposed on the base substrate 10, and an insulation layer or a planarization layer 501 can be provided between the touch layer 5 and the black matrix 12, and limitations are not imposed thereto.

For example, a material of the antistatic layer is metal or metal oxide. For example, the material of the antistatic layer can be indium tin oxide (ITO), and of course can be other materials, and limitations are not imposed thereto.

Second Embodiment

The present embodiment provides an in-cell touch display device including an array substrate and any one of the color filter substrates provided in the first embodiment. For example, the antistatic layer of the color filter substrate can be electrically connected with a first ground terminal of the array substrate.

Usually, in-cell touch display devices include two structures such as in-cell structure and on-cell structure. The in-cell display device means the touch units are embedded in the liquid crystal pixels, the on-cell display means touch units are embedded between a base substrate of a color filter substrate and a polarizer. Embodiments of the present invention can be applied to touch display devices of both of the structures of in-cell and on-cell, and static electricity can be eliminated from the above-mentioned touch display device. Due to the difference in structures between the on-cell display device and the in-cell display device, that disposing a plate-shaped transparent conductive antistatic layer has less influence on the touch function of the on-cell display device than the in-cell display device. Therefore, the embodiment of the present invention applied to the in-cell display device has better effect.

Usually, there are variety ways to realize in-cell touch display, and touch display devices based on the principle of self-capacitance or mutual capacitance principle are more popular. The embodiments of the present invention are not limited to the configuration of the touch units for realizing the touch function, and can be determined according to the actual application. For example, an in-cell display device can be based on the principle of self-capacitance to provide a single touch layer between a base substrate of a color filter substrate and a black matrix to realize touch, or, the in-cell display device can also be based on the mutual capacitance principle to provide a touch layer between a base substrate of a color filter substrate and a black matrix and provide another touch layer disposed on a base substrate of an array substrate. Of course, the in-cell display device can also be provided with a single touch layer only on a base substrate of an array substrate to form a full in-cell display device or the like based on the self-capacitance principle.

In the above-mentioned in-cell touch display devices, the position of the first ground terminal of the array substrate of the embodiments of the present invention is not limited. Because the array substrate includes a driving circuit module, the first ground terminal is usually provided on the driving circuit module.

In the embodiments of the present invention, only the structure related to the inventive point of the in-cell touch display device will be described in detail, and the person skilled in the art can learn from the common knowledge and the ordinary technology that the in-cell touch display device can include other components, for example, liquid crystals between a color filter substrate and an array substrate, a sealant, a spacer, and the like. The array substrate can further include a touch layer, a thin film transistor, a pixel electrode, and the like. And the redundant portions will be omitted here.

The embodiment provides an in-cell touch display device including an array substrate and any one of the above-mentioned color filter substrates, the antistatic layer of the color filter substrate can be electrically connected with the first ground terminal of the array substrate. Because the antistatic layer is only disposed in the non-display region, while a finger of a user is touching the touch display device, the capacitance between the finger and the touch unit cannot be affected by the antistatic layer, and the static electricity can be simultaneously conducted out. Therefore, the in-cell touch display device can eliminate static electricity without affecting touch function, and has strong antistatic capability.

Figure 7:
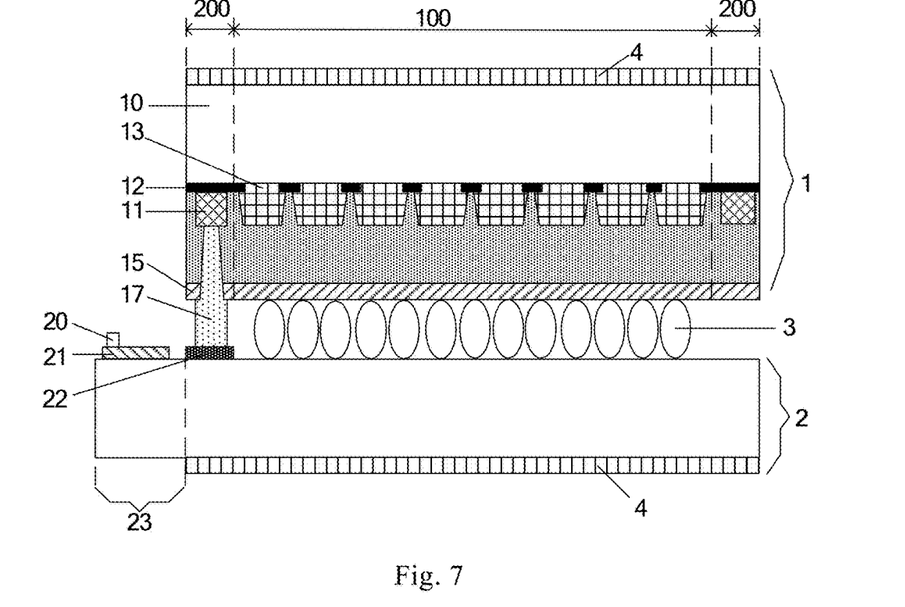
FIG. 7 is a structural schematic view of an in-cell touch display device provided by an embodiment of the present invention.
Figure 8:
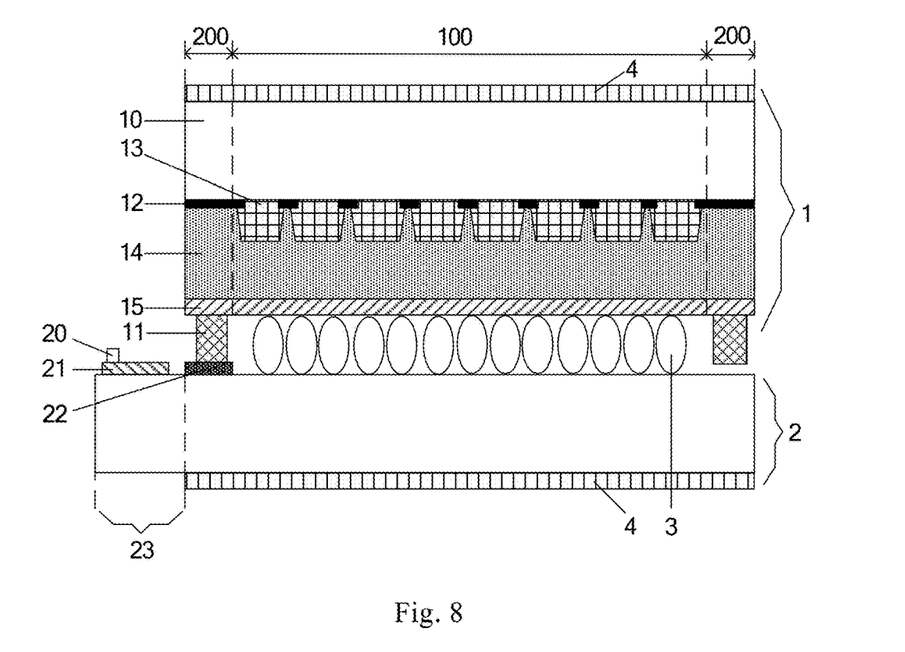
FIG. 8 is a structural schematic view of an in-cell touch display device provided by another embodiment of the present invention.

For example, as illustrated in FIG. 7 and FIG. 8, the in-cell touch display device includes a color filter substrate 1 and an array substrate 2 that are cell-assembled together, and liquid crystals 3 located between the color filter substrate 1 and the array substrate 2. The in-cell touch display device further includes a second ground terminal 22 and a driving circuit module 21, the second ground terminal 22 is provided on a position of the array substrate 2 where is opposite to the color filter substrate 1, and the driving circuit module 21 is disposed on an edge portion 23 of the array substrate 2 where is not opposite to the color filter substrate 1, the first ground terminal 20 is integrated in the driving circuit module 21, and the first ground terminal 20 is electrically connected with the second ground terminal 22.

Figure 9:
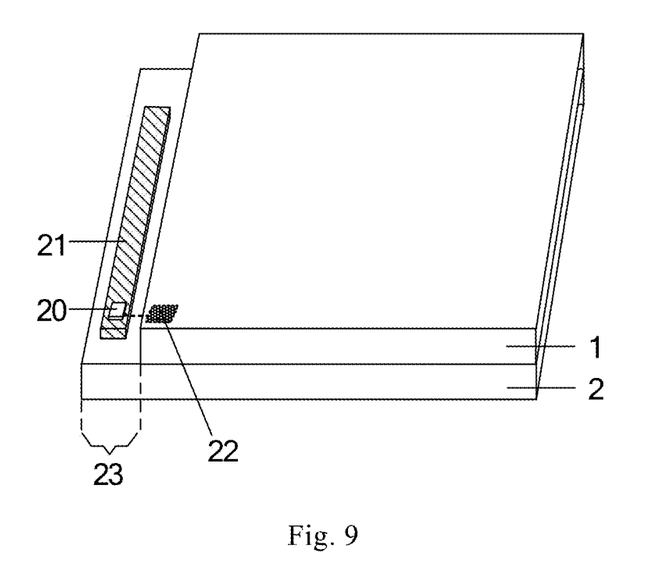
FIG. 9 is a perspective schematic view of an in-cell touch display device provided by an embodiment of the present invention.
Figure 10:
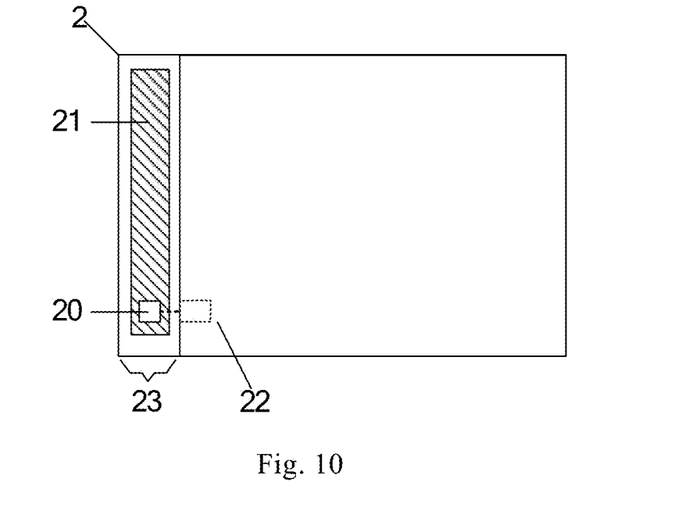
FIG. 10 is a top view of FIG. 9.

It should be noted that, because circuits such as gate driving circuit and source driving circuit are required to be provided on the array substrate, the array substrate 2 has at least one edge portion 23 which is not opposite to the color filter substrate 1 (the array substrate 2 protruding from the color filter substrate at the edge portion), as illustrated in FIG. 9 and FIG. 10, a driving circuit module 21 is provided on the edge portion 23 so as to dispose a driving circuit. The amount of the second ground terminal and the amount of the first ground terminals integrated in the driving circuit modules are not limited in the embodiments of the present invention, can be one, two, or the like. The drawings of the embodiments of the present invention are illustrated by taking the display device including one second ground terminal and one first ground terminal as an example. Moreover, the manner in which the first ground terminal and the second ground terminal are electrically connected is not limited, and for example, both of them can be connected as illustrated in FIG. 9 and FIG. 10 by a metal line (indicated by a dashed line).

In order to facilitate the electrical connection between the antistatic layer of the color filter substrate and the first ground terminal of the array substrate, a second ground terminal 22 is provided at the position of the array substrate 2 opposite to the color filer substrate 1, and the second ground terminal 22 is connected with the first ground terminal 20. Thus, after the color filter substrate and the array substrate are cell-assembled together, the antistatic layer only needs to be electrically connected with the second ground terminal. For example, as illustrated in FIG. 7, the second ground terminal 22 can be directly connected with the conductive member 17 to realize electrical connection of the conductive member and the antistatic layer. As illustrated in FIG. 8, the second ground terminal 22 can be directly connected with the antistatic layer 11. It should be noted that, the antistatic layer needs to be relatively thick, so as to be directly connected with the second ground terminal.

Two types of in-cell touch display devices of specific structures are to be described as follows in more detail.

First structure, referring to FIG. 7, a color filter substrate 1 includes a base substrate 10, and a black matrix 12, an antistatic layer 11, a planarization layer 14, an alignment film 15, and a conductive member 17 disposed on a side of the base substrate 10 close to an array substrate 2 in sequence. The color filter substrate 1 further includes a via hole 16 passing through the planarization layer 14 and alignment film 15. One end of the conductive member 17 is connected with the antistatic layer 11 via the via hole 16, and the other end of the conductive member 17 is connected with the second ground terminal 22.

Second structure, referring to FIG. 8, a color filter substrate 1 includes a base substrate 10, and a black matrix 12, a planarization layer 14, an alignment film 15, and an antistatic layer 11 sequentially disposed on a side of the base substrate 10 close to an array substrate 2. The antistatic layer 11 is connected with the second ground terminal 22.

Compared with the first structure, the second structure has advantages such as: a process of manufacturing via holes can be omitted when manufacturing a color substrate, it is no need to provide additional conductive member to connect the antistatic layer with the ground terminal of the array substrate. That is, with respect to the first structure, one patterning process can be omitted, the production process is simple. However, the antistatic layer in the first structure is provided on and in contact with the black matrix after the color filter substrate and the array substrate are cell-assembled, the antistatic layer is located farther from metal lines of the array substrate (e.g., gate lines, data lines, etc.), compared with the second structure, the influence of the antistatic layer on the metal lines of the array substrate can be reduced to some extent. Both structures have their own pros and cons, the specific choice can be determined based on actual application.

For example, referring to FIG. 7 and FIG. 8, in order to display better, polarizers 4 can be provided on an outer surface of the color filter substrate 1 and the array substrate 2 in the in-cell touch display device.

The embodiment provides an in-cell touch display device including an array substrate and any one of the above-mentioned color filter substrates, the antistatic layer of the color filter substrate can be electrically connected with a ground terminal of the array substrate. Because the antistatic layer is only provided in the non-display region, while a finger of a user is touching the touch display device, the capacitance between the finger and the touch unit cannot be affected by the antistatic layer, and the static electricity can be simultaneously conducted out. Therefore, the in-cell touch display device can eliminate the static electricity without affecting touch function, and has strong antistatic capability.

The following points need to be noted.

(1) Unless otherwise defined, the same reference numerals in the embodiments and the drawings of the present invention mean the same.

(2) Only the structures involved in the embodiments of the present invention are involved in the drawings of the embodiments of the present invention, other structures can refer to usual designs.

(3) In order to clearly illustrate, a layer or a region may be amplified in the drawings of the embodiments of the present invention. It is to be understood that, when a member such as a layer, a film, a region or a substrate is located or disposed on or below another member, the member can be located or disposed on or below the another member directly, or an intermediate member or intermediate member(s) can be provided.

(4) The features in different embodiments or the features in the same embodiments can be combined without conflict.

What have been described above are only specific implementations of the present invention, the protection scope of the present disclosure is not limited thereto. Any modifications or substitutions easily occur to those skilled in the art within the technical scope of the present disclosure should be within the protection scope of the present disclosure. Therefore, the protection scope of the present invention should be based on the protection scope of the claims.

This application claims the benefit of priority from Chinese patent application No. 201610004884.7, filed on Jan. 4, 2016, the disclosure of which is incorporated herein in its entirety by reference as a part of the present application.

What is claimed is:

1. A color filter substrate comprising a display region and a non-display region surrounding the display region, wherein the color filter substrate further comprises a conductive antistatic layer, and the antistatic layer is only disposed in the non-display region; and wherein the color filter substrate further comprises a base substrate, and a planarization layer, an alignment film and a conductive member which are located on the base substrate, wherein the planarization layer covers the base substrate with the antistatic layer formed thereon, the color filter substrate further comprises a via hole, the via hole passes through the planarization layer and the alignment film, and the conductive member is connected with the antistatic layer through the via hole; and wherein the conductive member is only disposed in the non-display region.

2. The color filter substrate according to claim 1, further comprising a black matrix located on the base substrate, wherein the black matrix and the antistatic layer are located on a same side of the base substrate.

3. The color filter substrate according to claim 2, wherein the antistatic layer is located on the black matrix and in contact with the black matrix.

4. The color filter substrate according to claim 1, wherein the antistatic layer is annular and surrounds a whole circumference of the display region.

5. The color filter substrate according to claim 1, wherein a material of the antistatic layer is metal or metal oxide.

6. The color filter substrate according to claim 1, further comprising a touch layer disposed on the base substrate, wherein a pattern of the touch layer and a pattern of the antistatic layer do not overlap in a direction perpendicular to the base substrate.

7. A touch display device comprising an array substrate and a color filter substrate according to claim 1.

8. The touch display device according to claim 7, wherein the antistatic layer of the color filter substrate is electrically connected with a first ground terminal of the array substrate.

9. A touch display device comprising an array substrate and a color filter substrate, the color filter substrate comprising a display region and a non-display region surrounding the display region, wherein the color filter substrate further comprises a conductive antistatic layer, and the antistatic layer is only disposed in the non-display region;
wherein the antistatic layer of the color filter substrate is electrically connected with a first ground terminal of the array substrate, and
wherein the touch display device further comprises a second ground terminal and a driving circuit module, wherein the second ground terminal is disposed on a position of the array substrate where is opposite to the color filter substrate, and the driving circuit module is disposed on an edge portion of the array substrate where is not opposite to the color filter substrate, the first ground terminal is integrated in the driving circuit module, and the first ground terminal is electrically connected with the second ground terminal.

10. The touch display device according to claim 9, wherein the color filter substrate further comprises a base substrate, and a black matrix, a planarization layer, an alignment film and a conductive member which are disposed on the base substrate, and the black matrix, the antistatic layer, the planarization layer, the alignment film and the conductive member are disposed on a side of the base substrate filter of the color substrate close to the array substrate in sequence, and the conductive member is connected with the second ground terminal.

11. The touch display device according to claim 9, wherein the color filter substrate further comprises a base substrate, and a black matrix, an alignment film which are disposed on the base substrate, and the black matrix, the alignment film and the antistatic layer are disposed on a side of the base substrate of the color filter substrate close to the array substrate in sequence, and the antistatic layer is connected with the second ground terminal.

12. The touch display device according to claim 9, wherein the color filter substrate further comprises an alignment film located on the base substrate, wherein the antistatic layer is in contact with the alignment film and located on the alignment film.

13. The touch display device according to claim 9, wherein the color filter substrate further comprises a base substrate, and a planarization layer, an alignment film and a conductive member which are located on the base substrate, wherein the planarization layer covers the base substrate with the antistatic layer formed thereon, the color filter substrate further comprises a via hole, the via hole passes through the planarization layer and the alignment film, and the conductive member is connected with the antistatic layer through the via hole.

14. The touch display device according to claim 13, wherein the conductive member is only disposed in the non-display region.

15. A touch display device comprising an array substrate and a color filter substrate, the color filter substrate comprising a base substrate, and a touch layer and an antistatic layer which are disposed on the base substrate, wherein a pattern of the touch layer and a pattern of the antistatic layer do not overlap in a direction perpendicular to the base substrate;
wherein the antistatic layer of the color filter substrate is electrically connected with a first ground terminal of the array substrate; and
wherein the touch display device further comprises a second ground terminal and a driving circuit module, wherein the second ground terminal is disposed on a position of the array substrate where is opposite to the color filter substrate, and the driving circuit module is disposed on an edge portion of the array substrate where is not opposite to the color filter substrate, the first ground terminal is integrated in the driving circuit module, and the first ground terminal is electrically connected with the second ground terminal.

16. The touch display device according to claim 15, wherein the color filter substrate further comprises a base substrate, and a black matrix, a planarization layer, an alignment film and a conductive member which are disposed on the base substrate, and the black matrix, the antistatic layer, the planarization layer, the alignment film and the conductive member are disposed on a side of the base substrate of the color filter substrate close to the array substrate in sequence, and the conductive member is connected with the second ground terminal.

17. The touch display device according to claim 15, wherein the color filter substrate comprises a base substrate, and a black matrix and an alignment film which are disposed on the base substrate, and the black matrix, the alignment film and the antistatic layer are disposed on a side of the base substrate of the color filter substrate close to the array substrate in sequence, and the antistatic layer is connected with the second ground terminal.

18. The touch display device according to claim 15, wherein the color filter substrate further comprises an alignment film located on the base substrate, wherein the antistatic layer is in contact with the alignment film and located on the alignment film.

19. The touch display device according to claim 15, wherein the color filter substrate further comprises a base substrate, and a planarization layer, an alignment film and a conductive member which are located on the base substrate, wherein the planarization layer covers the base substrate with the antistatic layer formed thereon, the color filter substrate further comprises a via hole, the via hole passes through the planarization layer and the alignment film, and the conductive member is connected with the antistatic layer through the via hole.

20. The touch display device according to claim 19, wherein the conductive member is only disposed in the non-display region.

\* \* \* \* \*